(12) United States Patent
Wallberg et al.

(10) Patent No.: US 7,498,890 B2
(45) Date of Patent: Mar. 3, 2009

(54) CONTINUOUS REVERSIBLE GEAR SHIFTING MECHANISM

(75) Inventors: John Wallberg, Richardson, TX (US); Robert Bogdan Staszewski, Garland, TX (US); Khurram Waheed, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 140 days.

(21) Appl. No.: 11/551,050

(22) Filed: Oct. 19, 2006

(65) Prior Publication Data

US 2007/0085622 A1 Apr. 19, 2007

Related U.S. Application Data

(60) Provisional application No. 60/728,274, filed on Oct. 19, 2005.

(51) Int. Cl.
H03L 7/085 (2006.01)
(52) U.S. Cl. .................. 331/17; 331/16; 331/1 A; 327/156; 375/376
(58) Field of Classification Search .............. 331/16, 331/17, 1 A, 44, 179; 327/156, 157, 159; 375/327, 373–376
See application file for complete search history.

(56) References Cited

U.S. PATENT DOCUMENTS

| 6,353,647 B1 * | 3/2002 | Wilhelmsson et al. ....... 375/376 |
| 2001/0005164 A1 * | 6/2001 | Okamoto .................... 331/17 |
| 2003/0133522 A1 | 7/2003 | Staszewski et al. |
| 2003/0235262 A1 * | 12/2003 | Staszewski et al. ......... 375/376 |
| 2004/0146132 A1 | 7/2004 | Staszewski et al. |
| 2005/0008113 A1 * | 1/2005 | Kokubo et al. .............. 375/376 |
| 2006/0033582 A1 | 2/2006 | Staszewski et al. |
| 2006/0038710 A1 | 2/2006 | Staszewski et al. |

OTHER PUBLICATIONS

R. B. Staszewski et al., "All-Digitial PLL and GSM/EDGE Transmitter in 90nm CMOS," IEEE International Solid-State Circuits Conference, Feb. 2005, pp. 316-217, 600.

R. B. Staszewski et al., "A Digitally Controlled Oscillator in a 90 nm Digital CMOS Process for Mobile Phones," IEEE Journal of Solid-State Circuits, vol. 40, No. 11, Nov. 2005, pp. 2203-2211.

(Continued)

Primary Examiner—Robert Pascal
Assistant Examiner—Ryan J. Johnson
(74) Attorney, Agent, or Firm—Ronald O. Neerings; Wade James Brady, III; Frederick J. Telecky, Jr.

(57) ABSTRACT

A novel gear shifting mechanism operative to adjust the loop gain of a phase locked loop (PLL) circuit in a continuous and reversible manner. The loop gain can be increased to widen the bandwidth of the loop and can also be decreased to narrow the loop bandwidth. The mechanism incorporates an $\alpha$ gear shift circuit, a $\rho$ gear shift circuit and an optional IIR gear shift circuit. The $\alpha$ gear shift circuit comprises a infinite impulse response (IIR) filtering which enables hitless operation of the PLL loop at the occurrence of gear shift events. The $\alpha$ gear shift circuit comprises an accumulator whose output is multiplied by the gain value $\rho$. The invention enables multiple gear shifts in either positive or negative direction to be achieved by configuring the loop gain variables $\alpha$ and $\rho$ which may be accomplished in software.

28 Claims, 6 Drawing Sheets

OTHER PUBLICATIONS

R. B. Staszewski et al., "All-Digital PLL and Transmitter for Mobile Phones," IEEE Journal of Solid-State Circuits, vol. 40, No. 12, Dec. 2005, pp. 2469-2482.

C. H. Hung et al., "A Digitally Controlled Oscillator System for SAW-Less Transmitters in Cellular Handsets," IEEE Journal of Solid-State Circuits, vol. 41, No. 5, May 2006, pp. 1160-1170.

K Muhammad et al., "The First Fully Integrated Quad-Band GSM/GPRS Receiver in a 90-nm Digital CMOS Process," IEEE Journal of Solid-State Circuits, vol. 41, No. 8, Aug. 2006, pp. 1772-1783.

Y. C. Ho et al. "Charge-Domain Signal Processing of Direct RF Sampling Mixer with Discrete-Time FIlters in Bluetooth and GSM Receivers," EURASIP Journal on Wireless Communications and Networking, vol. 2006, Article 62905, pp. 1-14.

M. Nakai et al., "Dynamic Voltage and Frequency Management for a Low-Power Embedded Microprocessor," IEEE Journal of Solid-State Circuits, vol. 40, No. 18, Jan. 2006, pp. 28-35.

* cited by examiner

CONTINUOUS REVERSIBLE GEAR SHIFTING MECHANISM

REFERENCE TO PRIORITY APPLICATION

This application claims priority under 35 U.S.C. §119(e) to U.S. Provisional Application Ser. No. 60/728,274, filed Oct. 19, 2005, entitled "Continuous Reversible Gear-Shifting Based on IIR Filtering Recursive Operation," incorporated herein by reference in its entirety.

FIELD OF THE INVENTION

The present invention relates to the field of communications and more particularly relates to a continuous reversible gear shift mechanism utilizing infinite impulse response (IIR)-like filtering for use in the loop filters of phase locked loops (PLLs).

BACKGROUND OF THE INVENTION

In modem digital radio design, the RF frequency synthesizer is a key block used for both up-conversion and down-conversion of radio signals. Traditionally, it has been based on a charge-pump PLL which is not easily amenable to scaled CMOS integration and suffers from high level of reference spurs generated by the correlative phase detection method. Use of a digitally-controlled oscillator (DCO) that deliberately avoids any analog tuning controls has been proposed and demonstrated for RF wireless applications. This allows for the loop control circuitry to be implemented in a fully digital manner as a digital-synchronous phase-domain all-digital PLL (ADPLL), which has been implemented commercially in single-chip Bluetooth and GSM radios.

A high level block diagram illustrating a prior art all digital phase-domain PLL (ADPLL) is shown in FIG. 1. The ADPLL, generally referenced 31, comprises a reference phase accumulator 32, time to digital converter (TDC) system 34, phase detector 36, loop filter 38, DCO gain normalizer 40 and DCO 42.

Since the conventional phase/frequency detector and charge pump are replaced in these designs by a time-to-digital converter (TDC), the phase-domain operation does not fundamentally generate any reference spurs thus allowing for the digital loop filter to be set at an optimal performance point between the reference phase noise and oscillator phase noise.

An important issue in frequency synthesis for today's wireless applications is the acquisition or settling time to a new channel frequency from the trigger event to the instance when the wireless terminal is ready to transmit or receive with the specified low level of frequency error, phase noise and spurious tones. Loop bandwidth in traditional PLL circuits is fixed to a narrow value during most part of the settling interval in order to guarantee proper quality of the synthesized clock during the normal operation. Unfortunately, it also severely slows down the loop dynamics. This difficulty in performing the PLL bandwidth switchover or gear shifting limits the PLL settling time to typically no less than a hundred µs, as is the case in many currently available commercial handset RF transceivers. One prior art base station PLL exhibits a 10 µs settling time but this was achieved by means of large area, high complexity and large current consumption.

The gain of PLL control loops often requires special settings for different modes of operation. Gear shifting changes the gain of the control loop to suit the various operating modes. For example, it is desirable to have high loop bandwidth while initially locking in acquisition mode in order that the PLL settle quickly. In tracking mode, however, it is desirable to have a low loop bandwidth to increase the performance of the PLL. A change in loop gain, however, typically causes an undesirable frequency step in the oscillator output.

Typically, it is difficult to perform PLL gear shifting in analog circuits because of the imperfect matching and voltage or charge losses during switching which results in phase hits whenever a sudden perturbation (i.e. gear-shift) is introduced. One prior art attempt to provide bandwidth switching performs a time-continuous adaptive gear-shifting for clock recovery applications. The loop gain is gradually reduced based on the filtered phase variations. As the loop settles, the phase detector output produces less and less variations at its output causing less charge to be stored on a capacitor. This is used, in turn, to gradually reduce bias in the charge pump, thus reducing the overall loop gain. Since the charge pump current is dynamically controlled, however, this creates an additional source of phase noise at the VCO input.

In another prior art attempt the variable loop bandwidth is switched by changing the charge pump current together with PLL loop filter parameters. Due to the switching issues, however, the achieved speedup is limited.

There is thus a need for a gear shift mechanism that can be used within an ADPLL to maximally speed up by at least an order of magnitude the acquisition of new channel frequencies. The gear shift mechanism should allow the ADPLL to provide adequate RF performance of a targeted wireless standard. Further, the mechanism should permit the PLL to start with an ultra-wide acquisition bandwidth that is progressively narrowed down. Moreover, it is desirable that the bandwidth switching carried out by the gear shifting mechanism be hitless through the entire settling and operational intervals.

SUMMARY OF THE INVENTION

The present invention is a gear shifting mechanism that is operative to adjust the loop gain of a phase locked loop (PLL) circuit. The mechanism is adapted for use in the loop filter circuit of a PLL loop and is capable of changing the loop gain in both a continuous and reversible manner. The loop gain can be increased to widen the bandwidth of the loop and can also be decreased to narrow the loop bandwidth. The gear shift mechanism comprises an $\alpha$ gear shift circuit, a $\rho$ gear shift circuit and an optional IIR gear shift circuit. The $\alpha$ gear shift circuit comprises an attenuator which enables hitless operation of the PLL loop at the occurrence of gear shift events. The $\alpha$ gear shift circuit comprises an accumulator whose output is multiplied by the gain value $\rho$. The invention enables multiple gear shifts in either positive or negative direction to be achieved by configuring the loop gain variables $\alpha$ and $\rho$ which may be accomplished in software.

The gear shift mechanism of the invention thus aids in enabling systems to achieve sufficient RF performance (e.g., RMS and peak phase error, error vector magnitude, EVM) and fast lock time to meet the requirements of many modem wireless standards. The ability to gear shift in the reverse direction (i.e. making the PLL loop faster) enables the system to handle sudden frequency deviations, which is useful in certain modulation schemes such as WCDMA, as well as sudden frequency perturbations such as those typically occurring in a handheld phone environment. In an implementation of the invention adapted for GSM, the ADPLL settled to the GSM frequency error within 15 µs, an order of magnitude faster than prior art solutions.

The invention provides a novel technique which can be used in the framework of an ADPLL to maximally speed up (by at least an order of magnitude) the acquisition of new channel frequencies. Using the gear shifting mechanism of the present invention in an ADPLL incorporating a DCO and associated varactor banks, the loop can start with an ultra-wide acquisition bandwidth and progressively narrow it down while traversing through finer DCO varactor banks. The fully digital implementation of the invention guarantees hitless bandwidth switching through the entire acquisition interval. Furthermore, since the oscillator control is fully digital, the last known control word for a given channel could be pre-loaded to reduce the initial frequency error.

There is thus provided in accordance with the invention, a gear shift apparatus for use in a control loop comprising a feedback register adapted to store a sample of an output of the gear shift apparatus, wherein the feedback register is sampled on the occurrence of a gear shift event, an attenuator incorporating a dynamically configurable gain, the attenuator operative to attenuate a signal input to the gear shift apparatus as a function of the gain and the sampled output to yield the gear shift output and wherein changes in the gain do not result in changes to the gear shift output.

There is also provided in accordance with the invention, a method of gear shifting a phase locked loop (PLL) loop gain G, the method comprising the steps of first multiplying a phase error signal by the loop gain G to generate a first product therefrom, sampling a gear shift output at occurrences of a gear shift event, second multiplying the sampled gear shift output by (1−G) to yield a second product therefrom and summing the first product and the second product to yield the gear shift output thereby.

There is further provided in accordance with the invention, an apparatus for gear shifting a phase locked loop (PLL) loop gain G comprising first calculating means for multiplying a phase error signal by the loop gain G to generate a first product therefrom, a sample register adapted to sample a tuning word output of the apparatus at an occurrence of a gear shift event, second calculating means for multiplying the sampled tuning word output by (1−G) to yield a second product therefrom and an adder operative to sum the first product and the second product to yield the tuning word output thereby.

There is also provided in accordance with the invention, a transmitter comprising a frequency synthesizer for performing a frequency modulation; the frequency synthesizer comprising a digital phase locked loop (DPLL), a loop filter of the DPLL incorporating loop gain G gear shifting means, the gear shifting means comprising first calculating means for multiplying a phase error signal by the loop gain G to generate a first product therefrom, a sample register adapted to sample a tuning word output at occurrences of a gear shift event, second calculating means for multiplying the sampled tuning word output by (1−G) to yield a second product therefrom, a summer operative to sum the first product and the second product to yield the tuning word output thereby and wherein the loop gain G is adapted to be changed continuously and reversibly yielding a hitless effect on the output of the loop filter.

There is further provided in accordance with the invention, a gear shift apparatus for adjusting the loop bandwidth in a phase locked loop (PLL), comprising a first gear shift circuit comprising a feedback register adapted to store a sample of an output of the first gear shift circuit, wherein the feedback register is sampled on the occurrence of a gear shift event, an attenuator incorporating a configurable gain G, the attenuator operative to attenuate a first input signal as a function of the gain G and the sampled output to yield a first output therefrom, a second gear shift circuit adapted to operate in parallel with the first gear shift circuit, the second gear shift circuit comprising an accumulator operative to integrate a second input signal to yield an integration result therefrom, a multiplier operative to multiply the integration result by a gain ρ to yield a second output thereby, an adder operative to sum the first output and the second output to yield a gear shift output therefrom and wherein changes in the gain G and the gain ρ are adapted to change the loop bandwidth without generating perturbations to the gear shift output.

Note that some aspects of the invention described herein may be constructed as software objects that are executed in embedded devices as firmware, software objects that are executed as part of a software application on either an embedded or non-embedded computer system such as a central processing unit (CPU), digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| ASIC | Application Specific Integrated Circuit |
| CMOS | Complementary Metal Oxide Semiconductor |
| CPU | Central Processing Unit |
| DCO | Digitally Controlled Oscillator |
| ADPLL | All Digital Phase Locked Loop |
| DSP | Digital Signal Processor |
| FCW | Frequency Command Word |
| FPGA | Field Programmable Gate Array |
| GSM | Global System for Mobile Communications |

-continued

| Term | Definition |
| --- | --- |
| HDL | Hardware Description Language |
| IIR | Infinite Impulse Response |
| NTW | Normalized Tuning Word |
| PLL | Phase Locked Loop |
| PVT | Process, Voltage, Temperature |
| RF | Radio Frequency |
| RMS | Root Mean Squared |
| TDC | Time to Digital Converter |
| VCO | Voltage Controlled Oscillator |
| WCDMA | Wideband Code Division Multiple Access |
| ZPR | Zero Phase Restart |

Gear Shifting Mechanism

The present invention is a gear shifting mechanism that is operative to adjust the loop gain or bandwidth of a phase locked loop (PLL) circuit at any time the PLL is operational. The mechanism is adapted for use in the loop filter circuit of a PLL loop and is capable of changing the loop gain or bandwidth in both a continuous and reversible manner. The mechanism achieves this through the use of infinite impulse response (IIR)-like filtering (i.e. attenuation) which enables smooth and hitless operation of the PLL loop when gear shifting occurs. Increasing the loop gain widens the bandwidth of the loop while decreasing the loop gain narrows the loop bandwidth.

Figure 1:
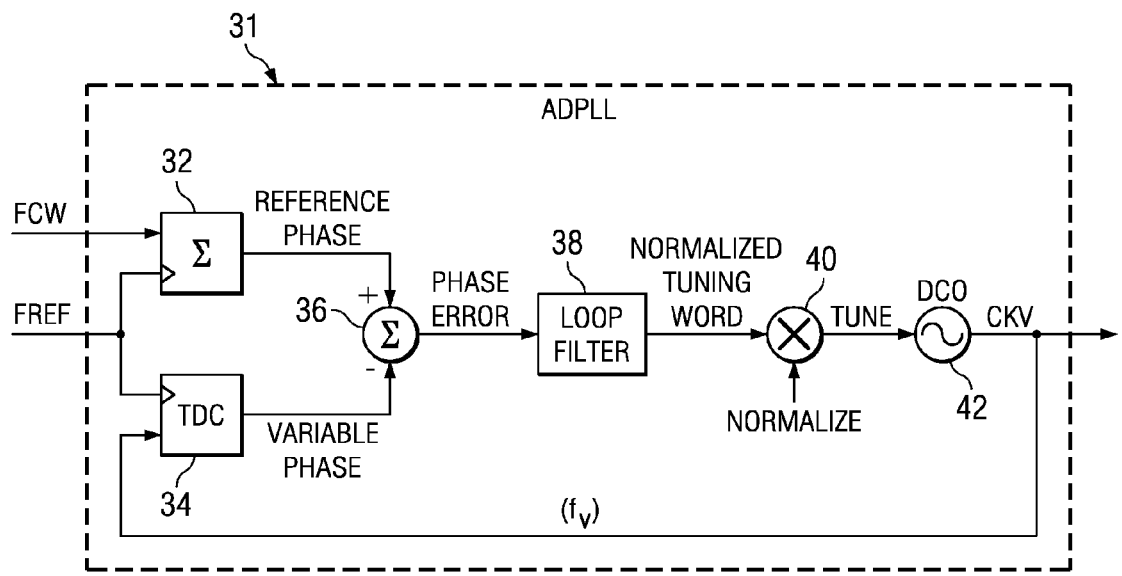
FIG. 1 is a high level block diagram illustrating a prior art all digital phase-domain PLL (ADPLL)
Figure 4:
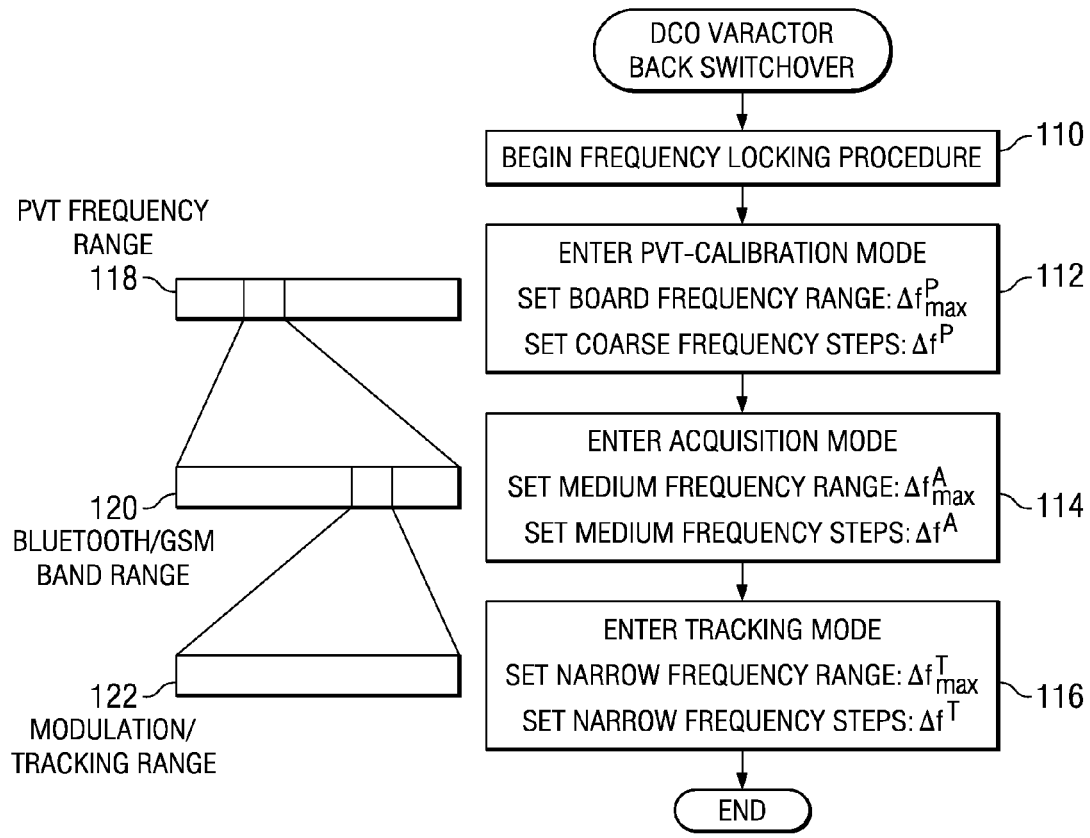
FIG. 4 is a flow diagram illustrating frequency range and step progression of the operational modes of the DCO.
Figure 2:
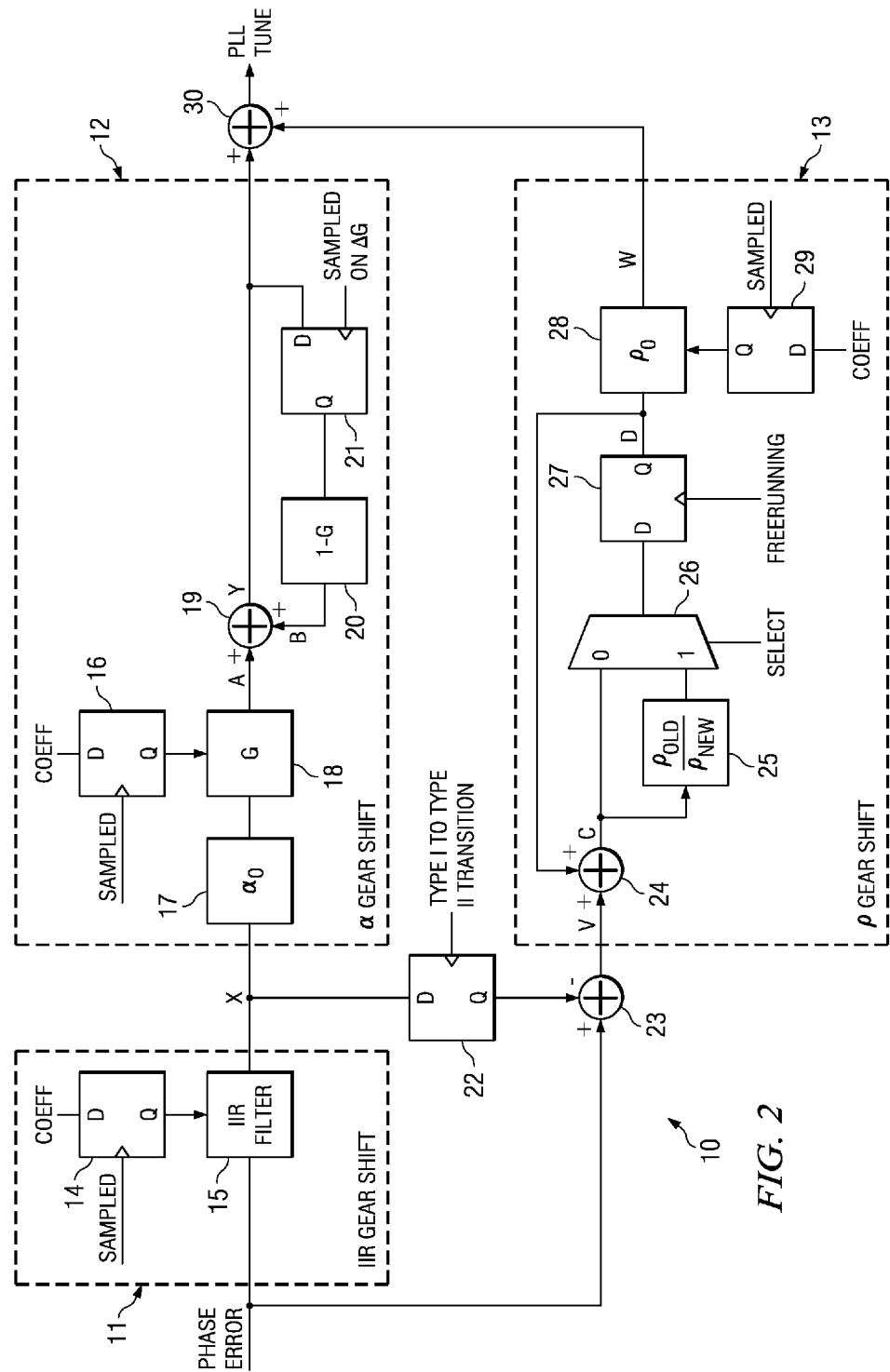
FIG. 2 is a block diagram illustrating the ADPLL bandwidth gear shifting mechanism of the present invention.

A block diagram illustrating the ADPLL bandwidth gear shifting mechanism of the present invention is shown in FIG. 2. The gear shift mechanism, generally referenced 10, comprises a plurality of sub-gear shift mechanisms including IIR gear shift 11, $\alpha$ (or proportional) gear shift 12 and $\rho$ (or integral) gear shift 13, and transition register 22 and adders 23, 30. The IIR gear shift 11 comprises coefficient register 14 and IIR filters block 15. The $\alpha$ gear shift 12 comprises multiplication by a configurable factor $\alpha$ 17, coefficient register 16, multiplication by a configurable loop gain G 18, adder 19, sample feedback register 21 and multiplication by (1−G) 20. The $\rho$ gear shift 13 comprises adder 24, multiplication by $$\frac{\rho_{OLD}}{\rho_{NEW}} 25,$$

multiplexer 26, sample feedback register 27, multiplication by $\rho$ 28 and coefficient register 29.

In accordance with the invention, both $\alpha$ and $\rho$ terms together affect the bandwidth or more particularly, frequency response, of the ADPLL. In the IIR gear shift block 11, the IIR filter is unity gain (Note: unity gain is defined as a gain of linear 1 or 0 dB at DC when clocked continuously). The coefficients, however, can be changed without negative implications to the operation of the gear shift mechanism or loop performance. In contrast to the prior art, the coefficient of the IIR filters 15 are dynamic and can be changed on the fly.

With reference to the $\alpha$ gear shift mechanism, $\alpha_0$ and G are multiplied together to provide an effective $\alpha$. The gear shifting is effected in this manner whereby the feed forward gain is changed without generating a DC perturbation to the system.

With reference to the $\rho$ gear shift block 13, the register 27 and adder 24 function as an integrator to accumulate the $\rho$ gain. The $\rho$ gear shift is operative to accumulate the phase error and multiply the result by the value $\rho$. This changes the dynamics of the loop from type-I to type-II operation. A type-I is an integrator-free system (the only integrator would be the DCO) wherein loop operation is proportional. A type-II loop has an integrator in its loop. A type-I loop is used when faster loop settling is desired and type-II loop is used when better noise performance is desired, especially removal of the DCO flicker noise.

When operating in a type I loop, the $\alpha$ gear shifting is sufficient since the integral portion (i.e. the $\rho$ gear shift) is not active. When the loop moves to type II operation, both the $\alpha$ and the $\rho$ coefficient values must be changed simultaneously to effect a gear shifting of the loop bandwidth without substantially changing the frequency response shape (only scaling would be preferred) and without negatively affecting the loop stability, such as gain or phase margins, or damping factor for type-II second-order systems.

In operation of the $\alpha$ gear shifting, the $\alpha_0$ is typically held constant while G is changed. This effectively changes the overall $\alpha$ value since $\alpha_0$ is multiplied with G. In operation of the $\rho$ gear shifting, changing the value of $\rho$ would normally create some perturbation to the loop. To prevent this, the $\rho$ gear shift block 13 comprises means for adjusting the input to compensate for the change in $\rho$. For example, to compensate for a change in the value of $\rho$ from 5 to 7, the input samples are decreased by a factor of 5/7. From then on, all inputs will have the effect of the new value for $\rho$ but without generating perturbations to the system.

In operation, the input x is multiplied by constant $\alpha_0$ and variable G to generate a signal A that sees an effective proportional constant $\alpha=\alpha_0 \times G$, which then is fed to one input of the summer 19. The output y is fed-back and sampled only on the occurrences of gear shift events. A gear shift event is defined as a change in the configurable loop gain parameter G (also referred to as $\alpha$ throughout this document). Thus, register 21 is not clocked by a free running clock but rather is clocked only when on changes to the loop gain G. The output of the sample register is multiplied by 1−G (signal B) and summed with signal A to generate the next output y.

An expression for the output y as a function of factor $\alpha$, loop gain G and input x is provided below in Equation 1.

$$y[n] = \alpha_0 \cdot G \cdot x[n] + (1-G) \cdot y[\text{sampled}] \tag{1}$$

where y[n] represents the gear shift output;

$\alpha_0$ represents a constant;

G represents the loop gain;

x[n] represents the input signal;

y[sampled] represents the sampled output.

To aid in understanding the principles of the present invention, an example of the operation of the $\alpha$ gear shift mechanism is presented below. The values of the various entities in the proportional gear shift mechanism are provided below in Table 1 for a series of input values x and values of loop gain G. In this example, there are two gear shift events (i.e. changes in loop gain) from 1 to 0.5 and from 0.5 to 0.25. This simulates the initial wide loop bandwidth operation of a PLL with the subsequent narrowing. Note that the value of $\alpha_0$ does not have to be 1—it just needs to be constant during the entire operation. However, it can change from operation to operation or from slot to slot. In fact, to ensure the ADPLL loop stability, the value of $\alpha_0$ need to be typically much lower than 1. The value of 1 is used as an example only. The initial value of G typically starts with 1.

TABLE 1

Example Operation of Proportional Gear Shift Mechanism

| x | $\alpha_0$ | G | 1-G | A | B | y |
|---|---|---|---|---|---|---|
| 10 | 1 | 1 | 0 | 10 | 0 | 10 |
| 11 | 1 | 1 | 0 | 11 | 0 | 11 |
| 10 | 1 | 1 | 0 | 10 | 0 | 10 |
| 10 | 1 | 0.5 | 0.5 | 5 | 5 | 10 |
| 11 | 1 | 0.5 | 0.5 | 5.5 | 5 | 10.5 |
| 10 | 1 | 0.5 | 0.5 | 5 | 5 | 10 |
| 10 | 1 | 0.25 | 0.75 | 2.5 | 7.5 | 10 |
| 11 | 1 | 0.25 | 0.75 | 2.75 | 7.5 | 10.25 |
| 10 | 1 | 0.25 | 0.75 | 2.5 | 7.5 | 10 |

In operation, the loop gain G can be configured by software, firmware, hardware or any combination thereof. The above example highlights the smooth and hitless operation of the gear shift mechanism. Changes in the loop gain do not cause frequency steps or perturbations in the output. During the two gear shifting events, the output Y is fairly constant and changes in the input x (i.e. three instances of the value '11') are smoothly reflected in the output y (i.e. 11, 10.5 and 10.25) as slight and gradual changes without any jumps in output value, thus providing 'hitless' operation. Each factor of ½ reduction in loop gain G does not create any output perturbations. Thus, the gear shifting mechanism functions to preserve the integrity of the loop transfer function while permitting the loop gain value to fluctuate without causing a perturbation to the system.

Typically, in operation, the value of the loop gain G starts at 1 and the value of y[sampled] is 0, thus y[n]=$\alpha_0$·x[n]. At the occurrence of a gear shift event, the new value of loop gain G is configured at the same time that the sample register is clocked to produce an updated y[sample]. Note that a value of loop gain 0<G≦1 represents a reduction in the overall gain value and narrows the bandwidth of the loop. Conversely, a value of loop gain 1≦G<∞ represents an increase in the overall gain value and widens the bandwidth of the loop. The gear shift mechanism thus provides maximum flexibility by providing complete programmability of the loop gain.

ADPLL Operation

Figure 3:
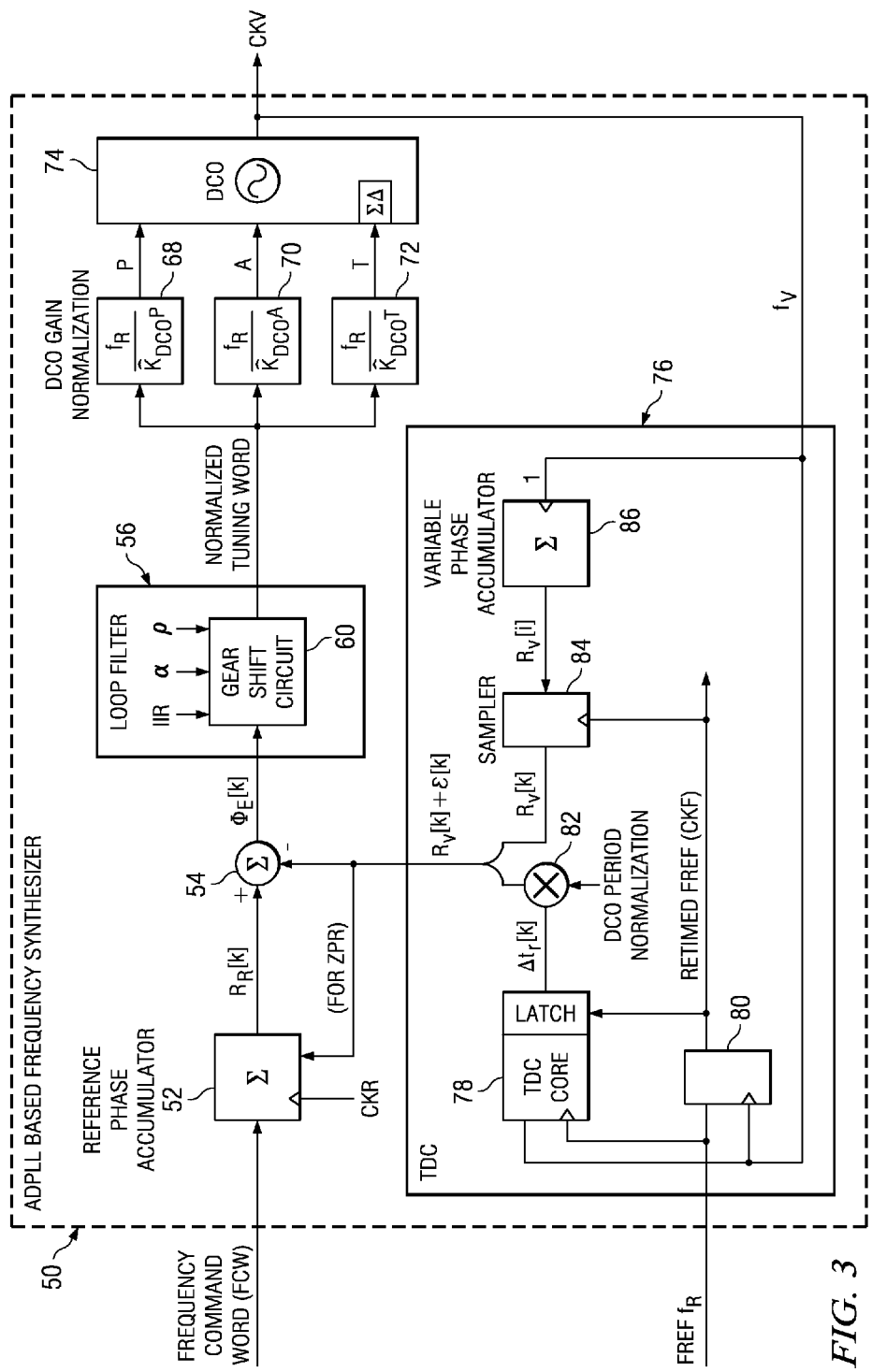
FIG. 3 is a block diagram illustrating an example all digital phase-domain PLL (ADPLL) incorporating the gear shift mechanism of the present invention.

A block diagram illustrating an example all digital phase-domain PLL (ADPLL) incorporating the gear shift mechanism of the present invention is shown in FIG. 3. Note that it is not intended that the invention be limited to the examples shown herein. One skilled in the art can apply the principles of the present invention to other control applications as well without departing from the scope of the invention.

The ADPLL-based frequency synthesizer, generally referenced 50, comprises a reference phase accumulator 52, phase detector 54, loop filter 56 incorporating the gear shift mechanism of the present invention 60, DCO gain normalization factors for different operating modes including: PVT 68, acquisition 70 and tracking 72, DCO 74 and TDC circuit 76. The TDC comprises a variable phase accumulator 86, sampler 84, retimer flip flop 80, TDC core 78 and DCO period normalization 82.

The output variable frequency ($f_V$) is related to the reference frequency ($f_R$) by the frequency command word FCW=$f_V/f_R$. The ADPLL operates in the phase domain by comparing the normalized DCO timestamps (i.e. variable phase) to the normalized ideal timestamps (i.e. reference phase) in the following manner as described in U.S. application Ser. No. 11/274,965, filed Nov. 15, 2005, entitled "Circuit For High-Resolution Phase Detection in a Digital RF Processor," incorporated herein by reference in its entirety. The integer portion of the variable phase $R_V[i]$ is determined by accumulating (via reference phase accumulator 52) the FCW with every cycle of the retimed frequency reference (FREF) clock input operating at $f_R$:

$$R_R[k] = \sum_{i=1}^{k} FCW[k].$$

The FREF-sampled variable phase $R_V[k]+\epsilon[k]$ is subtracted from the reference phase $R_R[k]$ in a synchronous arithmetic phase detector 54 producing phase error samples: $\phi_E[k]=R_R[k]-(R_V[k]+\epsilon[k])$. The FREF retiming quantization error $\epsilon[k]$ is determined by the time-to-digital converter (TDC) core 78. The TDC core is constructed as a simple array of inverter-delay elements and flip-flops, which produces a time conversion resolution finer than 20-30 ps in a deep-submicron CMOS process.

The digital phase error $\phi_E[k]$ is attenuated by the loop gain factor $\alpha$ and then normalized by the DCO gain $K_{DCO}$ in order to correct the DCO phase/frequency in a negative feedback manner with the loop dynamics that are independent from variations in the manufacturing process, supply voltage and operating temperature. The phase error attenuator factor $\alpha$ establishes the PLL loop first-order filtering characteristic:

$$f_{BW} = \frac{\alpha \cdot f_R}{2\pi} \qquad (2)$$

where, $f_{BW}$ is a 3-dB cut-off frequency of the closed PLL loop. For example, for Bluetooth operation, the $\alpha$ value is changed several times during the frequency locking with an initial value $\alpha=2^{-3}$ and final $\alpha=2^{-8}$ (i.e. five down gear-shift steps) value resulting in $f_{BW}$259 kHz and $f_{BW}$=8 kHz, respectively, for the $f_R$=13 MHz reference frequency. The final value of $\alpha$ was chosen to be the optimal tradeoff between the phase noise of the reference input and the DCO phase noise during TX and RX operations. The integral loop factor $\rho=2^{-18}$ is activated in the tracking mode shortly after the loop is fully settled. It switches the PLL characteristic from type-I to type-II with the damping factor $$\varsigma = \frac{1}{2}(\alpha\sqrt{\rho}) = 1$$

in order to effectively filter out the oscillator flicker noise, which is typically quite high in a deep-submicron CMOS.

DCO Varactor Bank Switchover

Figure 5:
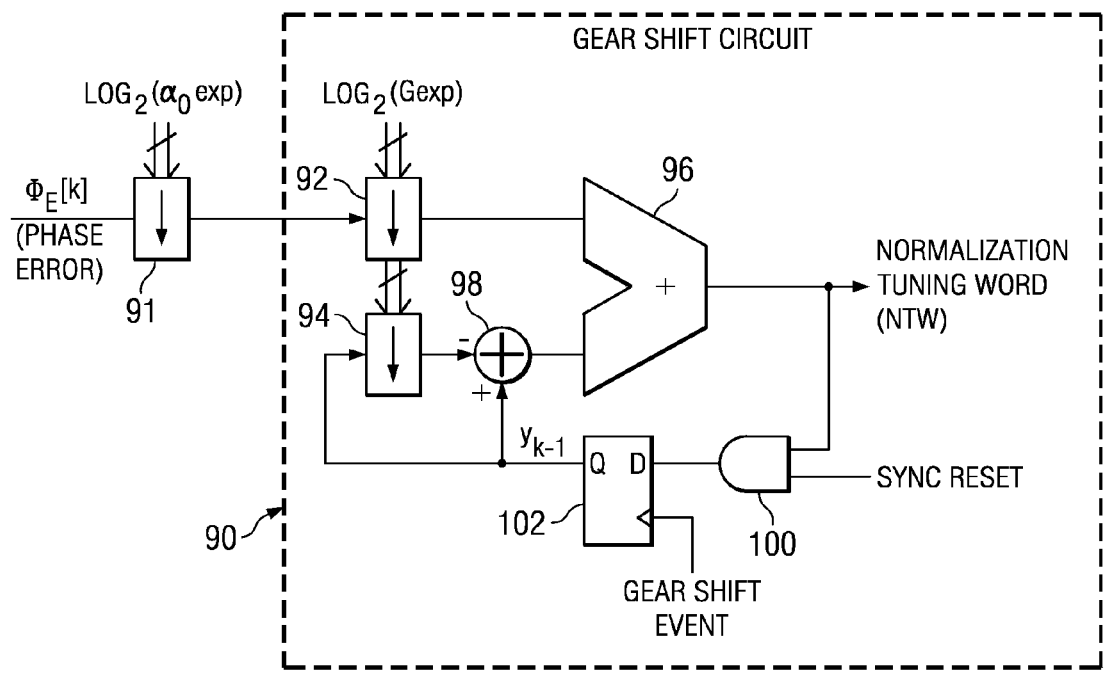
FIG. 5 is an example realization of the gear-shifting feedback mechanism of the present invention incorporating a switchable IIR filter.

A flow diagram illustrating frequency range and step progression of the operational modes of the DCO is shown in FIG. 5. As shown in the Figure, the three varactor banks, i.e. process/voltage/temperature ("P"), acquisition ("A") and tracking ("T"), are sequentially activated during the frequency locking process. The frequency tuning range 118, 120, 122 of each P, A, T bank, respectively, is shown next to its associated operating mode step. Upon initiating the frequency locking procedure (step 110), the PVT calibration mode (step 112) is entered where the loop is configured to have a broad frequency range $\Delta f_{max}^P$ and coarse frequency steps $\Delta f^P$. Upon entering the acquisition mode (step 114), the loop is configured to have a medium frequency range $\Delta f_{max}^A$ and medium frequency steps $\Delta f^A$. Upon entering the tracking mode (step 116), the loop is configured to have a narrow frequency range $\Delta f_{max}^T$ and narrow frequency steps $\Delta f^T$.

For the GSM example, the first two banks are used for the DCO center frequency calibration and channel selection with the step size of $\Delta f^P$=4 MHz and $\Delta f^A$=200 kHz, respectively, and use wide loop bandwidth to provide fast loop dynamics. The tracking bank is used during the actual transmission and has the finest frequency step size of $\Delta f^T$12 kHz. The fine frequency resolution is obtained through high-speed $\Sigma\Delta$ dithering of the varactors. For Bluetooth: $\Delta f^P$=2.3 MHz, $\Delta f^A$=460 kHz, $\Delta f^T$23 kHz.

During the active mode of operation, the new DCO tuning word is latched by the register with every clock cycle. Upon the DCO operational bank mode switchover, the last stored value of the tuning word is maintained by a register. Consequently, during regular operation, only one interface path can be active at a given time, whereas the previously executed modes maintain their final DCO control states. A zero phase restart (ZPR) mechanism is used to zero out the phase detector output to avoid any discontinuities in the oscillator tuning word during the mode switchover.

A short explanation of the ZPR principle follows. At the time of mode switchover, the tuning word of the last mode corresponds to a certain value of the phase error. This tuning word is frozen, so the phase error value that maintains it is no longer needed. The new mode, however, is always referenced to the new center frequency established by the last mode. Consequently, it operates on the excess phase error rather than the absolute phase error. Therefore, the old value of the phase error that corresponds to the frozen tuning word of the last mode would have to be constantly subtracted from the new phase error. The zero phase restart mechanism provides a better solution to this problem. In this way, a hitless progression through the three DCO operational modes is accomplished.

The ZPR mechanism is additionally utilized as a substitute for a synchronous reset of the variable phase accumulator. With reference to FIG. 3, the $R_V[i]$ digital incrementer operates at the ultra high clock rate and implementing a dedicated asynchronous or synchronous reset is expensive in terms of power dissipation and performance. Instead, an advantage is taken of the fact that, since the reference and variable phases operate on modulo arithmetic, their power-up absolute values do not matter—it is only their difference, i.e., the phase error, that is propagated further. Consequently, performing the zero-phase restart at the power-up essentially accomplishes the task of synchronous reset.

An example realization of the $\alpha$ gear-shifting feedback mechanism of the present invention incorporating a switchable IIR-like filter is shown in FIG. 5. The $\alpha$ gear shift circuit, generally referenced 90, shown in FIG. 5 is used in the loop filter 56 of the ADPLL of FIG. 3. The $\alpha$ gear shift circuit 90 comprises right bit shifters 92, 94, adder 96, 98, register 102 and gate 100. The circuit 90 is an alternative realization of the $\alpha$ gear-shifting mechanism using feedback. It comprises a single-stage IIR structure in which the hitless amplitude scaling factor $\alpha$ may be increased or decreased at discrete gear-shifting events.

In an all digital implementation, the loop gain $\alpha$ is made a power of 2 thereby permitting changes to the loop gain to be realized as bit shifts. For example, a factor of ½ reduction in loop gain is realized as a right shift of one bit. The 'sync reset' signal is used to zero out the sample register.

It is noted that the $\alpha$ gear shift circuit 90, although implemented differently, is functionally equivalent to the $\alpha$ gear shift circuit of FIG. 2. The expression in Equation 1 describing the operation of the gear shift circuit of FIG. 2, also describes the relationship between the normalized tuning word (NTW) output and the phase error $\phi_E[k]$ input of the $\alpha$ gear shift circuit 90 of FIG. 5.

SIMULATION RESULTS

Figure 6A:
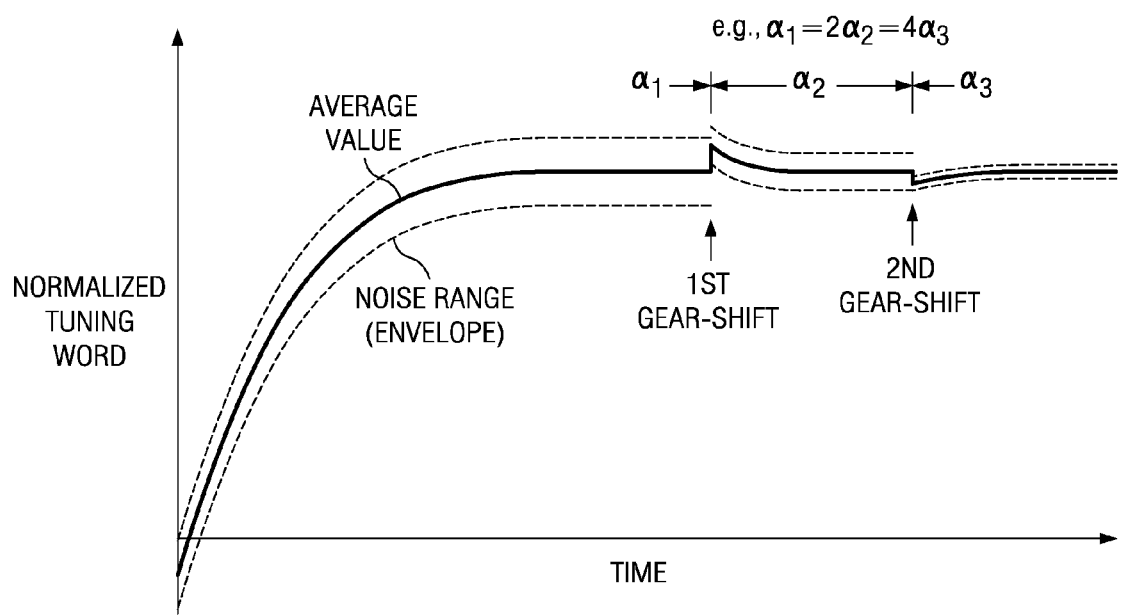
FIG. 6A is a conceptual graph illustrating the tuning word trajectory during frequency settling while undergoing two gear shift events.

A conceptual graph illustrating the tuning word trajectory during frequency settling while undergoing two gear shift events using the gear shift mechanism of the present invention is shown in FIG. 6A. The solid line represents the trajectory of the value of the tuning word while the dotted lines denote the maximum and minimum bounds of the noise envelope which is related to the loop bandwidth. The tuning word trajectory is generated when the PLL loop performs settling of an initial frequency error while undergoing two gear-shift events.

At the occurrence of a gear-shifting event, the last phase error sample value becomes the starting point for the new trajectory. The switching perturbation from the average trajectory could be as large as the noise distribution just before the event. Under the operating scheme in which the TDC noise is dominant, the amount of DCO tuning noise is directly proportional to the loop bandwidth or loop gain factor. Therefore, each down-shift of the loop gain in reduces the variability in the tuning word. Continual reduction in the loop bandwidth increases the DCO phase noise contribution, so at a certain point the tuning word starts to become noisier.

Figure 6B:
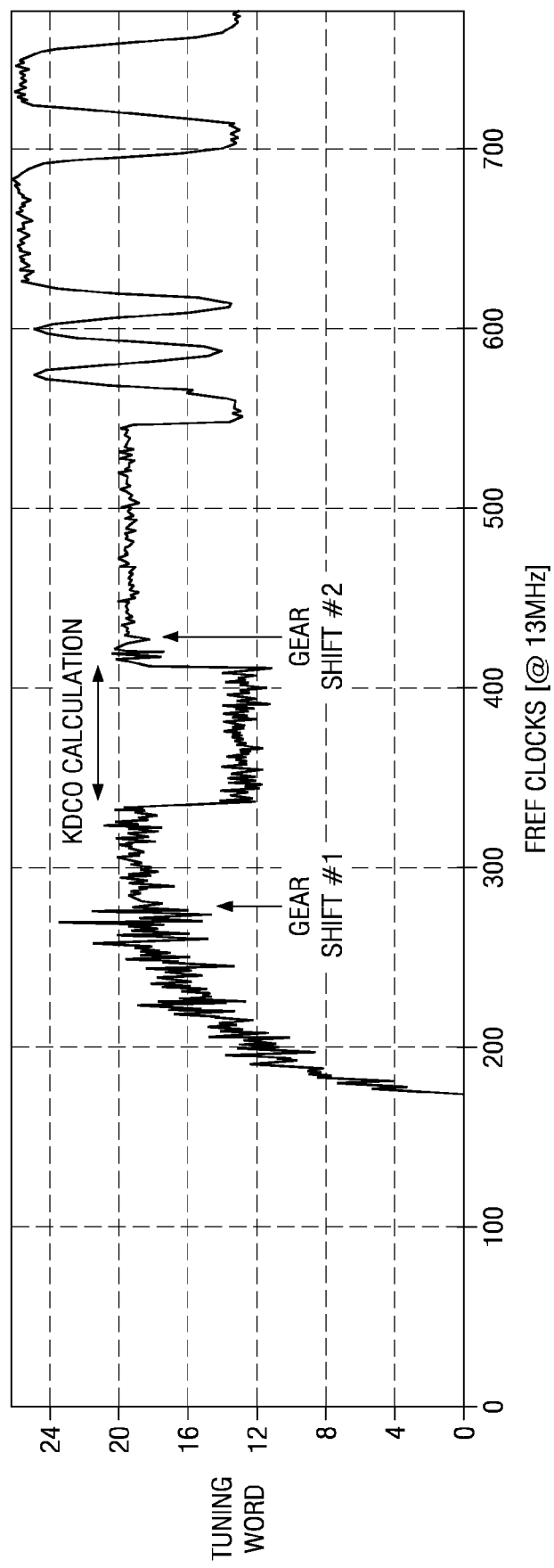
FIG. 6B is a simulated graph illustrating the tuning word trajectory during frequency settling while undergoing two gear shift events.

A graph illustrating the simulated tuning word trajectory during frequency settling while undergoing two gear shift events using the gear shift mechanism of the present invention is shown in FIG. 6B. The simulated trajectory shown in this Figure includes all system noise sources and imperfections. It is noted that the two gear shifts do not produce any perturbations in the tuning word.

Note that it is not critical to the invention the order of the processing blocks in the loop filter. In the simulation results presented in FIGS. 6A and 6, the gear shift mechanism is placed before the loop filters. If the gear shifting is placed before the loop filters, then the phase error is essentially unfiltered, and "noise" is likely to be sampled into the system. If, on the other hand, the gear shifting mechanism is placed after the loop filtering, then the phase error input to the gear shift mechanism is filtered, and "noise" will not be sampled into the system.

Figure 7A:
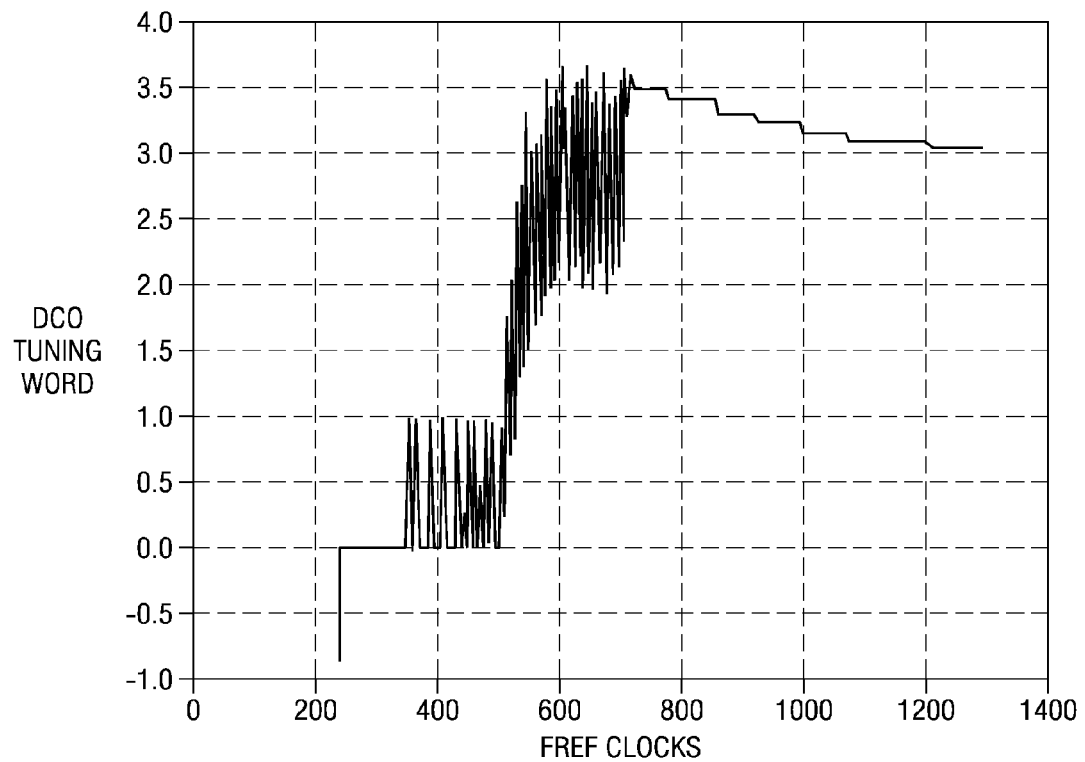
FIG. 7A is a simulated graph illustrating single gear shifting.
Figure 7B:
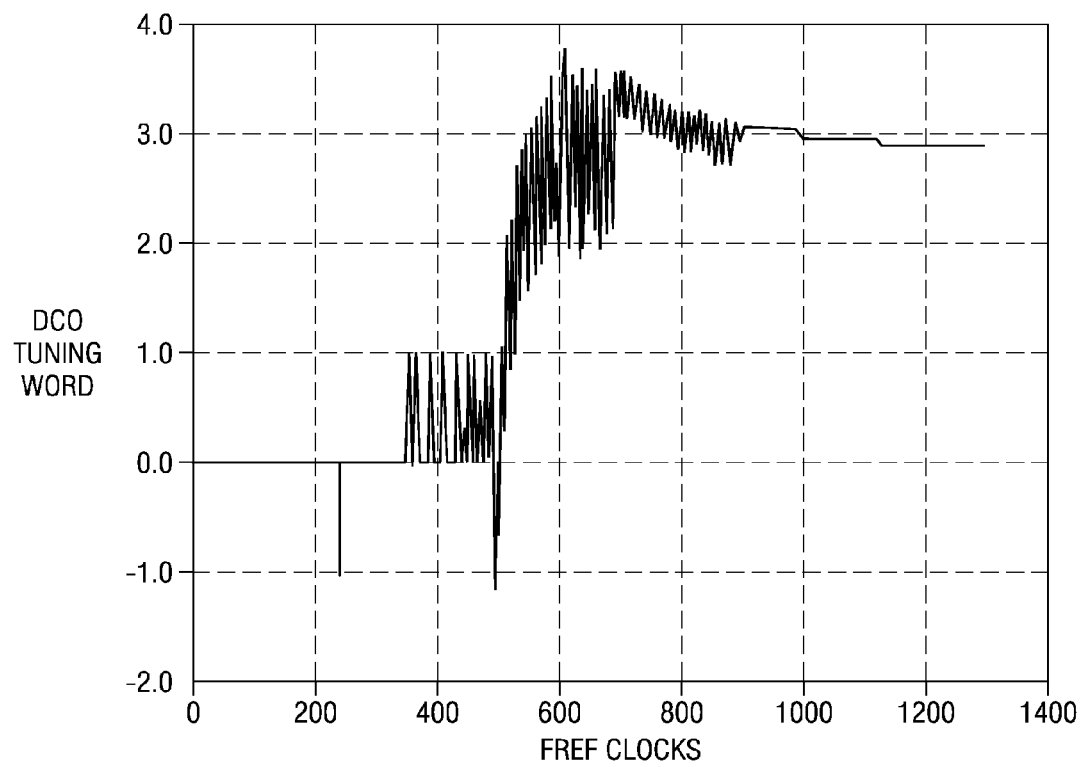
FIG. 7B is a simulated graph illustrating double gear shifting.

FIGS. 7A and 7B demonstrate the settling time advantage of the single and double gear-shift operations using the gear shift mechanism of the present invention. A simulated graph illustrating single gear shifting is shown in FIG. 7A. A simulated graph illustrating double gear shifting is shown in FIG. 7B.

The plots illustrate tuning word versus clock cycles. In both plots, the transition from acquisition mode to tracking mode occurs at approximately time 500 FREF clocks. Also in both plots, the first gear shifting event occurs at about time 700 FREF clocks. In the double gear-shifting case shown in FIG. 7B, the bandwidth change is half of that of the plot in FIG. 7A. The second gear shifting event in FIG. 7B occurs at approximately time 900 FREF clocks. Performance improvement can be seen in the double gear shifting (FIG. 7B) by comparing the slopes of the tuning words at time 1000 FREF clocks. The slope of the tuning word curve is relatively flat in the plot of FIG. 7B, while the slope in the plot of FIG. 7A is still pronounced at past 1200 FREF clock cycles.

In alternative embodiments, the methods of the present invention may be applicable to implementations of the invention in integrated circuits, field programmable gate arrays (FPGAs), chip sets or application specific integrated circuits (ASICs), DSP circuits, wired or wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A gear shift apparatus for use in a control loop, comprising:
   a feedback register adapted to store a sample of an output of said gear shift apparatus, wherein said feedback register is sampled on the occurrence of a gear shift event;
   an attenuator incorporating a dynamically configurable gain, said attenuator operative to attenuate a signal input to said gear shift apparatus as a function of said gain and said sampled output to yield said gear shift output; and
   wherein changes in said gain do not result in changes to said gear shift output.

2. The apparatus according to claim 1, wherein decreasing gain of said attenuator results in a decrease in said control loop bandwidth.

3. The apparatus according to claim 1, wherein increasing gain of said attenuator results in an increase in control loop bandwidth.

4. A gear shift apparatus for use in a control loop, comprising:
   a feedback register adapted to store a sample of an output of said gear shift apparatus, wherein said feedback register is sampled on the occurrence of a gear shift event;
   an attenuator incorporating a dynamically configurable gain, said attenuator operative to attenuate a signal input to said gear shift apparatus as a function of said gain and said sampled output to yield said gear shift output;
   wherein changes in said gain do not result in changes to said gear shift output; and
   wherein the operation of said attenuator is described by the following equation $$y[n]=\alpha \cdot G \cdot x[n]+(1-G) \cdot y[sampled]$$

wherein y[n] represents said gear shift output, α represents a constant, G represents said gain, x[n] represents said input signal, and y[sampled] represents said sampled output.

5. A method of gear shifting a phase locked loop (PLL) loop gain G, said method comprising the steps of:
   first multiplying a phase error signal by said loop gain G to generate a first product therefrom;
   sampling a gear shift output at occurrences of a gear shift event;
   second multiplying said sampled gear shift output by (1−G) to yield a second product therefrom; and
   summing said first product and said second product to yield said gear shift output thereby.

6. The method according to claim 5, wherein said loop gain G is adapted to be changed continuously and reversibly.

7. The method according to claim 5, wherein setting said loop gain G to a value less than one yields a reduction in loop gain resulting in a decrease in loop bandwidth.

8. The method according to claim 5, wherein setting said loop gain G to a value greater than or equal to one yields an increase in loop gain resulting in an increase in loop bandwidth.

9. The method according to claim 5, wherein said gear shift output represents a normalized tuning word.

10. The method according to claim 5, wherein said loop gain G is a power of two.

11. The method according to claim 5, wherein said multiplication by G and (1−G) is implemented as a bit-shift operation.

12. An apparatus for gear shifting a phase locked loop (PLL) loop gain G, comprising:
    first calculating means for multiplying a phase error signal by said loop gain G to generate a first product therefrom;
    a sample register adapted to sample a tuning word output of said apparatus at an occurrence of a gear shift event;
    second calculating means for multiplying said sampled tuning word output by (1−G) to yield a second product therefrom; and
    an adder operative to sum said first product and said second product to yield said tuning word output thereby.

13. The apparatus according to claim 12, wherein said phase error comprises a filtered phase error.

14. The apparatus according to claim 12, wherein said phase error comprises an unfiltered phase error.

15. The apparatus according to claim 12, wherein said loop gain G is adapted to be changed continuously and reversibly.

16. The apparatus according to claim 12, wherein decreasing said loop gain G yields a decrease in PLL loop bandwidth.

17. The apparatus according to claim 12, wherein increasing said loop gain G yields an increase in PLL loop bandwidth.

18. The apparatus according to claim 12, wherein said loop gain G is a power of two.

19. The apparatus according to claim 12, wherein said multiplication by G and (1−G) is implemented as a bit-shift operation.

20. A transmitter comprising:
    a frequency synthesizer for performing a frequency modulations, said frequency synthesizer comprising a digital phase locked loop (DPLL);
    a loop filter of said DPLL incorporating loop gain G gear shifting means, said gear shifting means comprising:
       first calculating means for multiplying a phase error signal by said loop gain G to generate a first product therefrom;
       a sample register adapted to sample a tuning word output at occurrences of a gear shift event;
       second calculating means for multiplying said sampled tuning word output by (1−G) to yield a second product therefrom;
       a summer operative to sum said first product and said second product to yield said tuning word output thereby; and
       wherein said loop gain G is adapted to be changed continuously and reversibly yielding a hitless effect on the output of said loop filter.

21. The transmitter according to claim 20, wherein decreasing said loop gain G yields a reduction in loop bandwidth.

22. The transmitter according to claim 20, wherein increasing said loop gain G yields an increase in loop bandwidth.

23. The transmitter according to claim 20, wherein said loop gain G is a power of two.

24. The transmitter according to claim 20, wherein said multiplication by G and (1−G) is implemented as a bit-shift operation.

25. A gear shift apparatus for adjusting the loop bandwidth in a phase locked loop (PLL), comprising:

a first gear shift circuit comprising:

a feedback register adapted to store a sample of an output of said first gear shift circuit, wherein said feedback register is sampled on the occurrence of a gear shift event;

an attenuator incorporating a configurable gain G, said attenuator operative to attenuate a first input signal as a function of said gain G and said sampled output to yield a first output therefrom;

a second gear shift circuit adapted to operate in parallel with said first gear shift circuit, said second gear shift circuit comprising:

an accumulator operative to integrate a second input signal to yield an integration result therefrom;

a multiplier operative to multiply said integration result by a gain $\rho$ to yield a second output thereby;

an adder operative to sum said first output and said second output to yield a gear shift output therefrom; and wherein changes in said gain G and said gain $\rho$ are adapted to change said loop bandwidth without generating perturbations to said gear shift output.

26. The apparatus according to claim 25, wherein said first gear shift circuit is adapted to operate in a type I loop.

27. The apparatus according to claim 25, wherein said second gear shift circuit is adapted to operate in a type II loop.

28. The apparatus according to claim 25, further comprising a third gear shift circuit coupled in series with said first gear shift circuit and said second gear shift circuit, said third gear shift circuit comprising one or more infinite impulse response (IIR) filters having configurable coefficients.

* * * * *